United States Patent [19]

Fathimulla

[11] Patent Number: 4,665,374

[45] Date of Patent: May 12, 1987

[54] MONOLITHIC PROGRAMMABLE SIGNAL PROCESSOR USING PI-FET TAPS

[75] Inventor: Mohammed A. Fathimulla, Columbia, Md.

[73] Assignee: Allied Corporation, Morristown, N.J.

[21] Appl. No.: 811,912

[22] Filed: Dec. 20, 1985

[51] Int. Cl.⁴ .................. H03H 9/145; H03H 9/76; H03H 9/64

[52] U.S. Cl. ................... 333/196; 310/313 R; 333/154; 333/166; 364/821; 357/26

[58] Field of Search .................. 333/150–155, 333/193–196, 166; 364/821, 819, 820, 822, 823, 824; 357/26; 310/313 R, 313 A, 313 B, 313 C, 313 D, 26; 330/5.5

[56] References Cited

U.S. PATENT DOCUMENTS

| | | | |
|---|---|---|---|
| 3,755,671 | 8/1973 | Lockwood | 29/25.35 X |
| 3,826,932 | 7/1974 | Wang | 330/5.5 X |
| 3,903,406 | 9/1975 | London | 357/26 X |
| 3,970,778 | 7/1976 | Adkins | 357/26 X |
| 4,065,736 | 12/1977 | London | 357/26 X |
| 4,129,798 | 12/1978 | Defranould | 357/26 X |
| 4,189,516 | 2/1980 | Dryburgh et al. | 310/358 X |
| 4,233,573 | 11/1980 | Grudkowski | 331/107 A |
| 4,243,960 | 1/1981 | White et al. | 333/196 |
| 4,328,473 | 5/1982 | Montress et al. | 333/154 |
| 4,354,130 | 10/1982 | Ono et al. | 310/313 A |
| 4,357,553 | 11/1982 | Minagawa et al. | 330/5.5 X |
| 4,365,216 | 12/1982 | Minigawa et al. | 330/5.5 X |
| 4,398,114 | 8/1983 | Minagawa et al. | 310/313 R |
| 4,437,031 | 3/1984 | Gunshor et al. | 310/313 B |

OTHER PUBLICATIONS

Hickernell et al., Saw Programmable Matched Filter Signal Processor, IEEE Ultrasonic Symposium 1980, pp. 104–108.

Grudkowski et al., GaAs Monolithic Saw Devices for Signal Processing and Frequency Control, IEEE Ultrasonics Symposium, 1980, pp. 88–97.

Matsumotos et al., MZOS-FET-TYPE Convoler, IEEE, 1980, Ultrasonics Symposium, pp. 129–132.

Greeneich et al., Theoretical Transducer Properties of Piezoelectric Insulator FET Transducers, *Journal of Applied Physics*, vol. 46, No. 11, Nov. 1975, pp. 4631–4640.

Green et al., Novel Programmable High-Speed Analog Transversal Filter, Electron Device Letters, vol. ED-L-3, No. 10, Oct. 1982, pp. 289–291.

Davis, Zinc Oxide-On-Silicon Programmable Tapped Correlator, Ultrasonics Symposium Proceedings, 1976, IEEE Cat. 76 CH1120-5SU, pp. 456–458.

Kusaka et al., Change in Capacitance in InP MIS Diodes Caused by the Pizeoelectric Effect, Physica Status Solidi (a) 80, Short Notes, pp. K25-K28.

*Primary Examiner*—Marvin L. Nussbaum
*Attorney, Agent, or Firm*—J. R. Ignatowski; Robert M. Trepp; Bruce L. Lamb

[57] ABSTRACT

A monolithic programmable signal processor with piezoelectric insulator FETs and an InP substrate. The piezoelectric insulator FETs are capable of being constructed on the same substrate with circuits associated with the signal processor and optical components.

17 Claims, 4 Drawing Figures

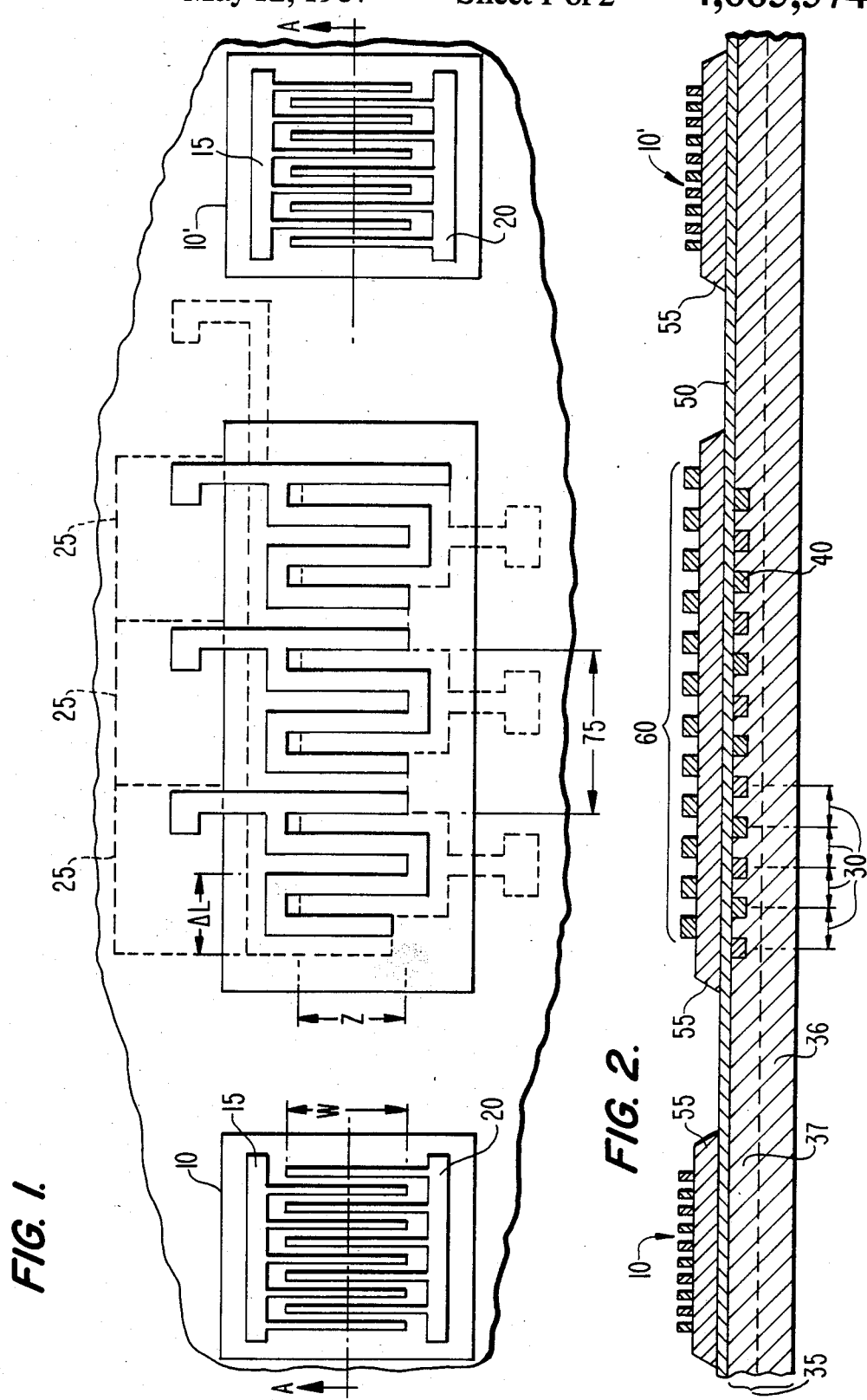

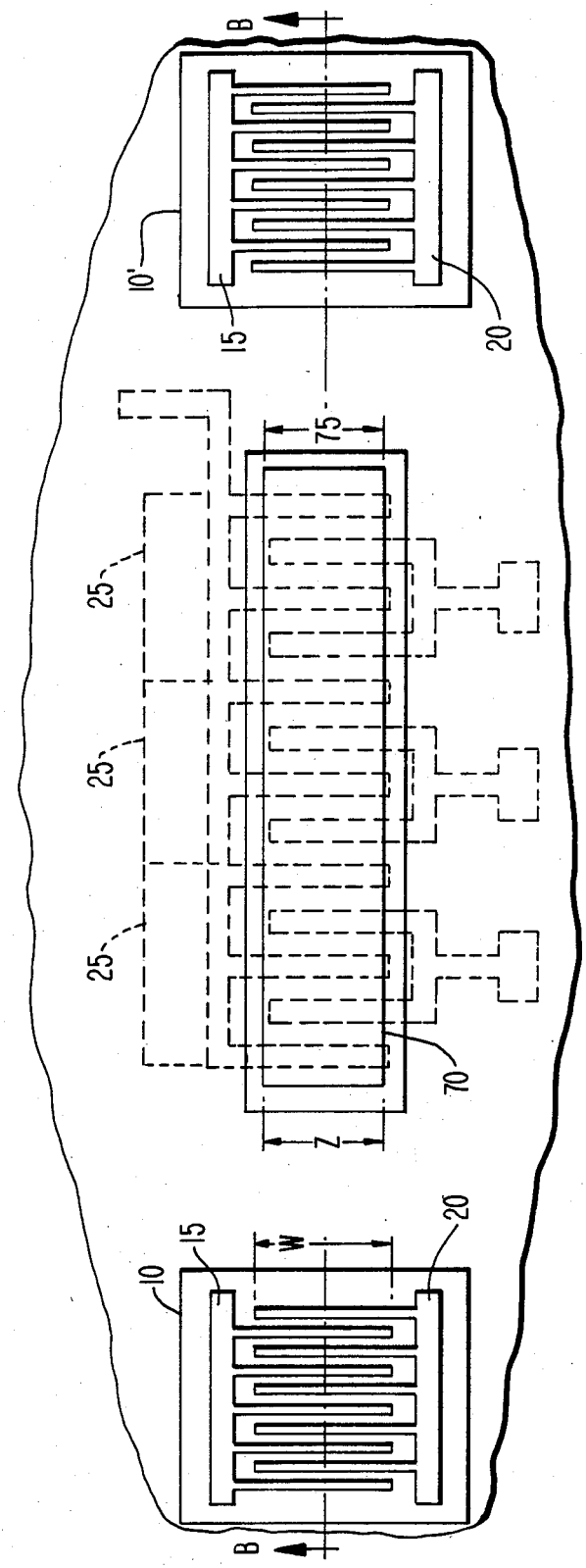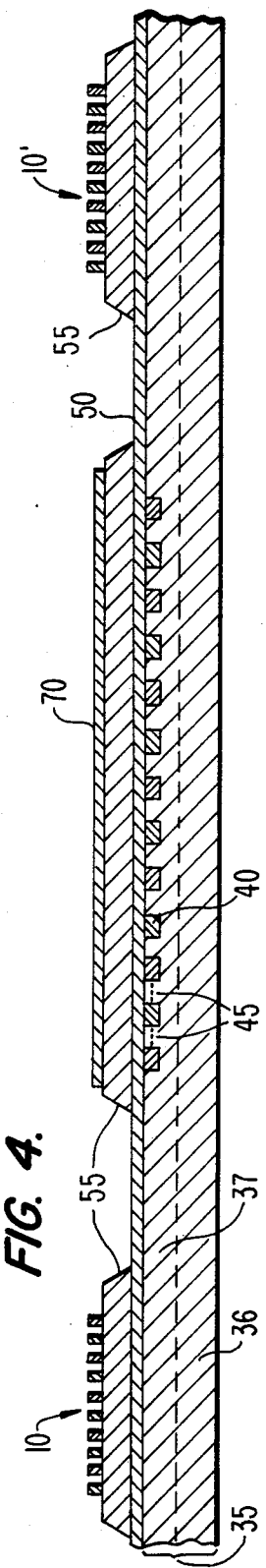
FIG. 3.
FIG. 4.

MONOLITHIC PROGRAMMABLE SIGNAL PROCESSOR USING PI-FET TAPS

BACKGROUND OF THE INVENTION

1. Field of the Invention

The present invention relates to a surface acoustic wave (hereinafter "SAW") signal processor, and more particularly to a SAW signal processor comprising piezoelectric insulator FETs (PI-FETs) taps.

2. Background of the Invention

Previously, SAW devices have been fabricated on Si, GaAs and piezoelectric substrates. With piezoeletric substrates, associated circuits cannot be integrated in a monolithic form. For surface acoustic waves, the piezoelectric properties of the GaAs substrates are relatively small; thus, limiting the bandwidth obtainable with each device. Previously, ZnO has been used to improve the bandwidth of SAW devices fabricated on Si and GaAs. However, it is very difficult to fabricate metal insulator semiconductor (MIS) devices in GaAs together with SAWs, because the interface between the piezoelectric dielectric layer and the GaAs substrate degrades the operating characteristics of the MIS devices.

It is difficult to obtain a close acoustical match between Si substrates and a ZnO piezoelectric dielectric layer. As a result, in ZnO SAW devices fabricated on Si substrates the acoustic waves tend to disperse throughout the device structure; thus, degrading the operation of the SAW devices.

SUMMARY OF THE INVENTION

Accordingly, it is an object of the present invention to provide a monolithic programmable signal processor having minimum wave dispersion within the device.

Another object of the present invention is to provide a monolithic programmable signal processor having improved power dissipation characteristics.

A further object of the present invention is to provide a monolithic programmable signal processor capable of being easily fabricated on a substrate with MIS devices.

Still a further object of the present invention is to provide a monolithic programmable signal processor enabling both enhancement and depletion mode SAW devices to be easily constructed on the same substrate.

Still another object of the present invention is to provide a monolithic programmable signal processor having wide dynamic range and bandwidth and high processing gain.

To achieve the above and other objects the monolithic programmable signal processor of the present invention comprises: a substrate selectively comprising one of InP and Si, and having a first conductivity type; spaced apart regions formed in the substrate each having a second conductivity type opposite the first conductivity type; piezoelectric layers selectively formed on the substrate; gate means, formed on the piezoelectric layer, for controlling conduction between respective ones of the spaced apart regions; and transducer means for producing surface acoustic waves and for applying the surface acoustic waves to the piezoelectric layer.

In a preferred embodiment of the monolithic programmable signal processor of the present invention, the substrate selectively comprises one of InP and Si and has a P-type conductivity, and each of the spaced apart regions has an N-type conductivity. In the case of InP devices the substrate structure comprises a semiinsulating InP layer with an InP epitaxial or epi layer formed thereon. The epi layer is doped with a P-type dopant to a concentration of approximately $10^{16}$ cm$^{-3}$ and has a thickness of approximately 0.5 micron. An insulator layer is formed on the substrate and comprises one of $SiO_2$, $Al_2O_3$ and $Si_3N_4$, and the piezoelectric layer comprises one of ZnO and AlN. The gate means comprises a plurality of gate electrodes formed on a first portion of the piezoelectric layer and respectively aligned over spaces between the spaced apart regions. The transducer means comprises transducer electrodes formed on second and third portions of the piezoelectric layer, the second and third portions of the piezoelectric layer being spaced apart from the first portion of the piezoelectric layer.

Employing piezoelectric insulator FETs to sample SAWs in a signal processor provides the advantage of being able to construct circuits associated with the signal processor on the same substrate as the processor resulting in a selfcontained unit such as programmable correlator or transversal filter. In addition, enhancement and depletion mode devices can be easily constructed on the same substrate. These and other advantages of the present invention will be more apparent when reading the specification together with the appended figures.

BRIEF DESCRIPTION OF THE DRAWINGS

The accompanying drawings illustrate embodiments of the present invention, and together with the description serve to explain the principles of the invention. In the drawings, similar elements are labeled with like reference numerals.

FIG. 1 is a plan view of the chip layout for a first embodiment of the present invention;

FIG. 2 is a cross-sectional view taken along line A—A in FIG. 1;

FIG. 3 is a plan view of the chip layout for a second embodiment of the present invention; and FIG. 4 is the cross-sectional view taken along line B—B of FIG. 3.

DETAILED DESCRIPTION OF THE PREFERRED EMBODIMENTS

FIG. 1 illustrates a plan view of a chip layout for a first embodiment of the monolithic programmable signal processor of the present invention. A transducer 10, when suitably excited by an applied voltage between electrodes 15 and 20, generate surface acoustic waves (hereinafter "SAWs") which are launched towards taps 25. As illustrated in FIG. 1, each tap includes four FETs 30. Depending upon the application, the number of FETs 30 can be increased or decreased in accordance with the bandwidth and phase matching properties of the contra propagating signals of the monolithic programmable signal processor.

FIG. 2 is a cross-sectional view of the device illustrated in FIG. 1 taken along the line A—A. The device of the present invention comprises an InP substrate 35 which has a SAW velocity of 2635 m/sec, or a Si substrate 35 which as a SAW velocity of 4600 m/sec. The InP substrate 35 comprises a semiinsulating InP layer 36 with an epitaxial layer InP 37 formed thereon. Source/drain regions 40 are formed in the InP epitaxial layer 37 of the substrate 35. An insulator layer 50 is formed on the InP substrate 35. The insulator layer minimizes the unwanted surface state density that would result at the interface between a piezoelectric layer and the substrate 35 comprising InP, and to improve the characteristics of MIS devices formed using this layer. The insulator layer 50 is unnecessary when the substrate 35 comprises Si, because in such a case the piezoelectric layer comprises AlN. The interface between AlN and Si does not require formation of any insulator layer therebetween. When the substrate comprises InP, the insulator layer 50 is formed of, for example, $Al_2O_3$, $SiO_2$ or $Si_3N_4$. Gate electrode 60 is positioned on the piezoelectric layer 55 and above the spaces between the source/drain regions 40. For depletion mode devices, the regions 45 (FIG. 4) having the same conductivity type as the epi layer 37 are formed between the source/drain regions 40.

Referring to FIG. 2, transducers 10 and 10' are formed on portions of the ZnO layer 55. When driven with a voltage frequency signal, the transducers 10 and 10' generate SAWs which propagate toward the taps 25. The overlap W of the transducer electrodes must be less than or equal to the width Z shown in FIGS. 1 and 3. The structure of SAW transducers 10 and 10' is well known to those skilled in the art and is therefore not described in detail herein.

For n-channel, enhancement mode FETs, the the epi layer 37 has a P-type conductivity and the source/drain regions 40 are doped to have an N-type conductivity with a carrier concentration in the range of $10^{17}$ to $10^{18}$ $cm^{-3}$. The insulator layer 50 formed on an InP substrate has a thickness of approximately 500 Å.

The thickness of the piezoelectric layer 55 is selected in accordance with the coupling constant of the substrate and the frequency at which the programmable signal processor is to be operated. Typically, the coupling constant of the layer structure ZnO and InP substrate 35 peaks at $\lambda/20$ and $\lambda/5$, where $\lambda$ is the acoustic wavelength. For example, using (1) a 250 MHz signal and ZnO as the piezoelectric layer 55 which has a SAW velocity of 2760 m/sec; and (2) the $\lambda/5$ value for the coupling constant, the thickness of the ZnO layer would be 2.2 um. Because the SAW velocity in an InP substrate is almost identical to the SAW velocity in a ZnO piezoelectric layer, there is little dispersion of the SAWs throughout the device.

In fabricating the devices shown in FIGS. 1 and 2, the $SiO_2$ insulating layer 50 is deposited on the InP substrate 35 via, for example, plasma CVD, or UV-CVD. The ZnO layer 55 can be deposited on the insulator layer 50 using for example either plasma CVD or sputtering techniques.

FIGS. 3 and 4 illustrate a second embodiment of the monolithic programmable signal processor of the present invention. Elements in this second embodiment corresponding to those of the first embodiment are labeled with like reference numerals.

In the embodiment of FIGS. 3 and 4, the gate electrode 70 covers the entire interaction region 75. The interaction region 75 has a width Z and comprises the region underlying the gate electrode 70; that is, the region occupied by the source, drain and channel regions for each of the taps 25. In this embodiment, the taps 25 are controlled by a single gate electrode 70. Such an arrangement simplifies the manufacture, processing and circuitry associated with the signal processor, since only one gate electrode 70 is formed and driven by, for example, amplifier and filter circuits.

The present invention has a number of applications, such as in correlators and convolvers. The operation of these devices is well known to those skilled in the art.

For example, when employing the present invention in a correlator receiving frequency shift key coded signals, the spacing 75 between corresponding drains on adjacent taps 25 is equal to the SAW velocity in the device divided the chip rate of the input signal. The phase of each tap 25 is controlled by the polarity of $V_{DS}$ for each tap, and the amplitude of each tap is controlled by the magnitude of $V_{DS}$ for each tap. Thus, tap weighting can be accomplished by setting $V_{DS}$ to achieve the desired amplitude and phase for each tap. To operate the device as a convolver, each of the taps would be uniformly biased using for example, a single gate electrode 70, as shown in FIG. 3.

The devices shown in FIGS. 1 and 3 can be fabricated by selectively doping n+ regions 40 in the epi layer 37. These regions 40 can be formed by, for example, thermally diffusing the impurities using an oxide mask or by ion implanting the impurities followed by annealing. Next, source and drain contacts are formed. Then, the insulator layer 50 (for InP substrates) is deposited via plasma CVD or sputtering techniques. Following deposition of the insulator layer 50, the piezoelectric layer 55 is selectively deposited on the insulator layer 50, or on the Si substrate 35 where no insulator is needed. Finally the gate electrodes (60 or 70) and transducer electrodes 15 are formed on the piezoelectric layer 55. Fabrication of piezoelectric FETs is well known in the art. Accordingly, detailed discussion of the fabricating steps is omitted.

The monolithic programmable signal processor of the present invention provides a highly nonlinear output due to the inversion (enhancement) mode operation. Additionally, the InP substrate provides good thermal properties so that more power can be dissipated by the devices, and enables associated circuits to be fabricated in the same substrate so that a self contained device such as a correlator can be produced. Furthermore, the InP substrate enables optical components to be formed on the same substrate as the programmable signal processor.

What is claimed is:

1. A monolithic programmable signal processor comprising:
    a substrate, having a first conductivity type, selected from the group of semiconductors comprising silicon (Si) and indium phosphide (InP);
    a first piezoelectric layer formed on a first portion of said substrate;
    at least one transducer for generating surface acoustic waves propagating along the surface of said first piezoelectric layer along a predetermined path;
    a set of parallel source electrodes having a second conductivity type formed in said substrate along said predetermined path in the region underlying said first piezoelectric layer, said parallel source electrodes being disposed perpendicular to said predetermined path of said surface acoustic waves and said second cuductivity type being opposite said first conductivity type;
    a set of parallel drain electrodes having said second conductivity type interdigitally formed in said substrate between said first set of parallel source electrodes, each of said interdigitally formed parallel source and drain electrodes being separated from each other by a predetermined interelectrode space; and
    gate means formed on the surface of said piezoelectric layer for controlling the conductivity between said gate and source electrodes, said gate means covering at least the portion of said piezoelectric layer which overlays each of said interelectrode spaces.

2. A monolithic programmable signal processor according to claim 1 wherein:
said gate means comprises a plurality of gate electrodes formed on the surface of said piezoelectric layer and aligned over said interelectrode spaces; and
said piezoelectric layer comprises one of the piezoelectric materials selected from the group comprising ZnO and AlN.

3. A monolithic programmable signal processor according to claim 2, wherein said at least one transducer is formed on a second piezoelectric layer disposed on the surface of said substrate, said second piezoelectric layer being spaced apart from said first piezoelectric layer.

4. A monolithic programmable signal processor according to claim 3, further comprising an insulator layer positioned between said substrate and at least said first piezoelectric layer.

5. A monolithic programmable signal processor according to claim 4, wherein the first conductivity type is p-type and the second conductivity type is n-type.

6. A monolithic programmable signal processor according to claim 4, further comprising regions formed in said substrate between said parallel source and drain electrodes having said first conductivity type.

7. A monolithic programmable signal processor according to claim 3 wherein said at least one transducer comprises two transducers disposed at opposite ends of said first piezoelectric layer and generating surface acoustic waves propagating along said predetermined path towards each other.

8. A monolithic programmable signal processor according to claim 7, wherein said second transducer is formed on a third piezoelectric layer disposed on the surface of said substrate, said third piezoelectric layer being spaced apart from said first piezoelectric layer.

9. A monolithic programmable signal processor according to claim 8, further including an insulator layer positioned between said substrate and at least said first piezoelectric layer.

10. A monolithic programmable signal processor according to claim 9, wherein the first conductivity type is p-type and the second conductivity type is n-type.

11. A monolithic programmable signal processor according to claim 9, wherein the first conductivity type is n-type and the second conductivity type is p-type.

12. A monolithic programmable signal processor according to claim 9, further comprising regions formed in said substrate between said parallel source and drain electrodes having said first conductivity type.

13. A monolithic programmable signal processor according to claim 8 wherein said second and third piezoelectric layers are contiguous portions of said first piezoelectric layers.

14. A monolithic programmable signal processor according to claim 1, wherein said gate means comprises an electrode covering the portion of said piezoelectric layer overlaying said source and drain electrode and said predetermined interelectrode space.

15. A monolithic programmable signal processor comprising:
an InP substrate having a p-type conductivity;
an insulating layer disposed on the surface of said substrate;
a ZnO piezoelectric layer selectively formed on a first portion of said insulating layer;
at least one transducer disposed on said substrate for generating surface acoustic waves which propagate along the surface of said piezoelectric layer along a predetermined path;
a set of parallel source electrodes having an n-type conductivity formed in said InP substrate along said predetermined path in the region underlying said ZnO piezoelectric layer, said parallel source electrodes being disposed perpendicular to said predetermined path of said surface acoustic waves;
a set of parallel drain electrodes, having an n-type conductivity, interdigitally formed in said InP substrate between said set of parallel source electrodes, said interdigitally formed parallel source and drain electrodes being separated from each other by a predetermined interelectrode space; and
gate means formed on the surface of said ZnO piezoelectric layer for controlling the conductivity between said gate and source electrodes, said gate means covering at least the portion of said piezoelectric layer which overlays each of said interelectrode spaces.

16. A monolithic programmable signal processor according to claim 15, further comprising p-type conductivity regions formed in said substrate and respectively positioned between said said parallel source and drain electrodes.

17. A monolithic programmable signal processor comprising:
an InP substrate having a p-type conductivity;
an insulating layer disposed on the surface of said substrate;
a ZnO piezoelectric layer selectively formed on a first portion of said insulating layer;
at least one transducer disposed on said substrate for generating surface acoustic waves which propagate along the surface of said piezoelectric layer along a predetermined path;
a set of parallel source electrodes having an n-type conductivity formed in said InP substrate along said predetermined path in the region underlying said ZnO piezoelectric layer, said parallel source electrodes being disposed perpendicular to said predetermined path of said surface acoustic waves;
a set of parallel drain electrodes, having an n-type conductivity, interdigitally formed in said InP substrate between said set of parallel source electrodes, said interdigitally formed parallel source and drain electrodes being separated from each other by a predetermined interelectrode space; and
gate means formed on the surface of said ZnO piezoelectric layer for controlling the conductivity between the gate and source electrodes, said gate means covering the portion of said ZnO piezoelectric layer which overlays said gate electrodes, said source electrodes, and said interelectrode spaces.

* * * * *